(12) United States Patent
Chen

(10) Patent No.: US 8,953,401 B2
(45) Date of Patent: Feb. 10, 2015

(54) MEMORY DEVICE AND METHOD FOR DRIVING MEMORY ARRAY THEREOF

(71) Applicant: United Microelectronics Corp., Hsin-Chu (TW)

(72) Inventor: Hsin-Wen Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 234 days.

(21) Appl. No.: 13/707,611

(22) Filed: Dec. 7, 2012

(65) Prior Publication Data

US 2014/0160861 A1    Jun. 12, 2014

(51) Int. Cl.
*G11C 7/00* (2006.01)
*G11C 7/12* (2006.01)
*G11C 11/419* (2006.01)

(52) U.S. Cl.
CPC ............... *G11C 7/12* (2013.01); *G11C 11/419* (2013.01)
USPC .......................................... 365/203; 365/202

(58) Field of Classification Search
CPC .............................. G11C 7/12; G11C 11/419
USPC ..................... 365/203, 202, 189.11
See application file for complete search history.

(56) References Cited

U.S. PATENT DOCUMENTS

| | | |
|---|---|---|
| 3,663,828 A | 5/1972 | Low |
| 3,818,402 A | 6/1974 | Golaski |
| 4,163,944 A | 8/1979 | Chambers |
| 4,245,355 A | 1/1981 | Pascoe |
| 4,409,608 A | 10/1983 | Yoder |
| 4,816,784 A | 3/1989 | Rabjohn |
| 5,159,205 A | 10/1992 | Gorecki |
| 5,208,725 A | 5/1993 | Akcasu |
| 5,212,653 A | 5/1993 | Tanaka |
| 5,406,447 A | 4/1995 | Miyazaki |
| 5,446,309 A | 8/1995 | Adachi |
| 5,583,359 A | 12/1996 | Ng |
| 5,637,900 A | 6/1997 | Ker |
| 5,760,456 A | 6/1998 | Grzegorek |
| 5,808,330 A | 9/1998 | Rostoker |
| 5,880,990 A * | 3/1999 | Miura ............................ 365/154 |
| 5,923,225 A | 7/1999 | De Los Santos |
| 5,959,820 A | 9/1999 | Ker |
| 6,008,102 A | 12/1999 | Alford |
| 6,081,146 A | 6/2000 | Shiochi |
| 6,172,378 B1 | 1/2001 | Hull |
| 6,181,640 B1 * | 1/2001 | Kang ............................ 365/203 |
| 6,194,739 B1 | 2/2001 | Ivanov |

(Continued)

OTHER PUBLICATIONS

Azeez J. Bhavnagarwala, "A Sub-600-mV, Fluctuation Tolerant 65-nm CMOS SRAM Array With Dynamic Cell Biasing", IEEE Journal of Solid State Circuits vol. 43 No. 4, Apr. 2008.

*Primary Examiner* — Vu Le

(74) *Attorney, Agent, or Firm* — Winston Hsu; Scott Margo

(57) ABSTRACT

A memory array includes a plurality of columns of memory cells and each column of memory cells of the memory array is coupled to a local voltage source, a bit line, and a bit line bar. Provide a working voltage to pre-charge the bit line and the bit line bar of the column of memory cells when a memory cell of the column of memory cells is selected to be read, and meanwhile use local voltage sources coupled to remaining columns of memory cells of the memory array to provide high voltages lower than the working voltage to pre-charge bit lines and bit line bars of the remaining columns of memory cells.

9 Claims, 7 Drawing Sheets

(56) References Cited

U.S. PATENT DOCUMENTS

| | | |
|---|---|---|
| 6,246,271 B1 | 6/2001 | Takada |
| 6,285,578 B1 | 9/2001 | Huang |
| 6,291,872 B1 | 9/2001 | Wang |
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,672,100 B2 | 3/2010 | Van Camp |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0047349 A1 | 3/2007 | Tokito |
| 2007/0058448 A1 | 3/2007 | Joshi |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0116279 A1 | 5/2009 | Maeda |
| 2009/0201625 A1 | 8/2009 | Liao |
| 2010/0279484 A1 | 11/2010 | Wang |

* cited by examiner

MEMORY DEVICE AND METHOD FOR DRIVING MEMORY ARRAY THEREOF

BACKGROUND OF THE INVENTION

1. Field of the Invention

The present invention is related to a memory array, and more particularly, to a memory array having read and/or write assist functions.

2. Description of the Prior Art

FIG. 1 is a diagram illustrating prior art memory cell 102 and pre-charge circuit 104. The memory cell 102 may be a commonly used 6T SRAM (static random access memory) cell and is located in a column of cells of a plurality of columns of cells in a memory array. The pre-charge circuit 104 may be used to pre-charge a pair of bit line BL and bit line bar BLB coupled to the memory cell 102 before a read cycle or a write cycle of the memory array.

FIG. 2 is a waveform diagram of FIG. 1. The horizontal axis of FIG. 2 is time t. From top to bottom of FIG. 2 are word line WL voltage, bit line BL and bit line bar BLB voltages, and storage nodes Na and Nb voltages. If the memory cell 102 is half selected, the bit line BL and the bit line bar BLB are pre-charged to a working voltage VDD before the read cycle by setting a control signal Pre_b to logic low for turning on PMOS transistors PP1 and PP2 of the pre-charge circuit 104. After the bit line BL and the bit line bar BLB are pre-charged to the working voltage VDD, the control signal Pre_b changes to logic high for turning off the PMOS transistors PP1 and PP2, then a word line WL is set to logic high for starting the read cycle. As shown in FIG. 2, either the storage node Na or Node Nb of the half selected memory cell 102 is prone to be disturbed during the read cycle because the bit line BL and the bit line bar BLB are pre-charged to the working voltage VDD, which causes higher divided voltage (Disturb weak point in FIG. 2) at node Na or node Nb. Therefore, how to prevent disturbance in the half selected memory cell 102 during the read cycle is an issue worth exploring.

SUMMARY OF THE INVENTION

An embodiment of the invention discloses a memory device, which comprises a bit line, a bit line bar, a write buffer, a sense amplifier, and a column multiplexer. The column multiplexer outputs data from the bit line and the bit line bar to the sense amplifier, and outputs data from the write buffer to the bit line and the bit line bar. The local voltage source comprises a first NMOS transistor and a second NMOS transistor. The first NMOS transistor has a first end for receiving a working voltage, a second end coupled to the bit line, and a control end. The second NMOS transistor has a first end for receiving the working voltage, a second end coupled to the bit line bar, and a control end coupled to the control end of the first NMOS transistor.

Another embodiment of the invention discloses a method for driving a memory array. The memory array comprises a plurality of columns of memory cells, and each column of memory cells of the memory array is coupled to a local voltage source, a bit line, and a bit line bar. The method comprises providing a working voltage to pre-charge the bit line and the bit line bar of the column of memory cells when a memory cell of the column of memory cells is selected to be read, and meanwhile using local voltage sources coupled to remaining columns of memory cells of the memory array to provide high voltages lower than the working voltage to pre-charge bit lines and bit line bars of the remaining columns of memory cells.

Another embodiment of the invention discloses a method for driving a memory array. The memory array comprises a plurality of columns of memory cells, and each column of memory cells of the columns of memory cells is coupled to a local voltage source, a bit line, and a bit line bar. The local voltage source comprises a first NMOS transistor coupled between a working voltage and the bit line, and a second NMOS transistor coupled between the working voltage and the bit line bar. A control end of the first NMOS transistor is coupled to a control end of the second NMOS transistor. The method comprises providing a high voltage lower than the working voltage to one of the bit line and the bit line bar of the column of memory cells when a memory cell of the column of memory cells is selected to be written, and meanwhile providing a low voltage to another one of the bit line and the bit line bar of the column of memory cells.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
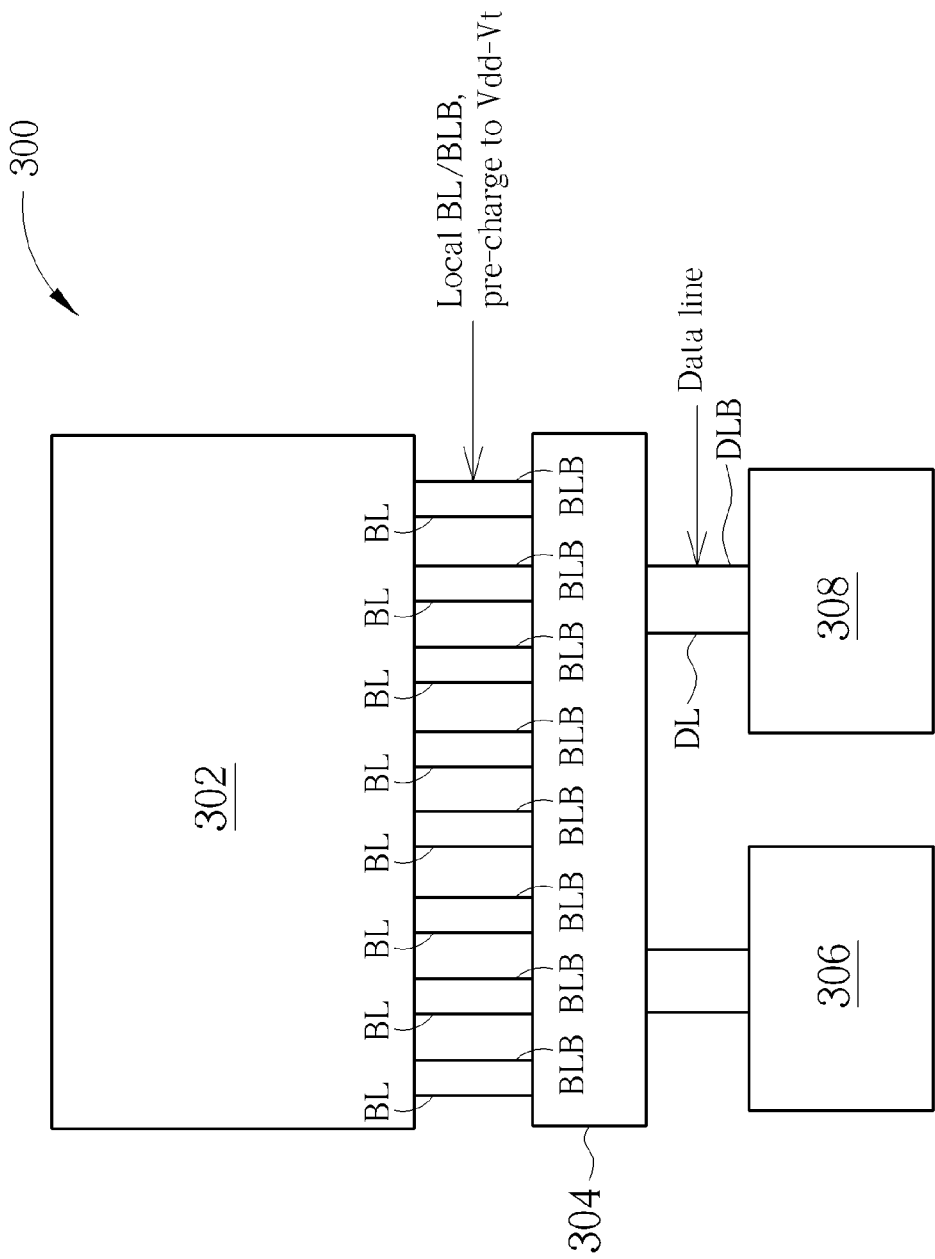
FIG. 3 is a diagram illustrating a memory device according to an embodiment of the present invention.

FIG. 3 is a diagram illustrating a memory device 300 according to an embodiment of the present invention. The memory device 300 may include a memory array 302, a plurality of pairs of bit line BL and bit line bar BLB, a column multiplexer 304, a write buffer 306, and a sense amplifier 308. The memory array 302 may include a plurality of columns of memory cells. Each pair of bit line BL and bit line bar BLB is coupled to a corresponding column of memory cells in the memory array 302. The column multiplexer 304 is used to output data from a selected pair of bit line BL and bit line bar BLB to the sense amplifier 306 and is used to output data from the write buffer 306 to the selected pair of bit line BL and bit line bar BLB.

Figure 4:
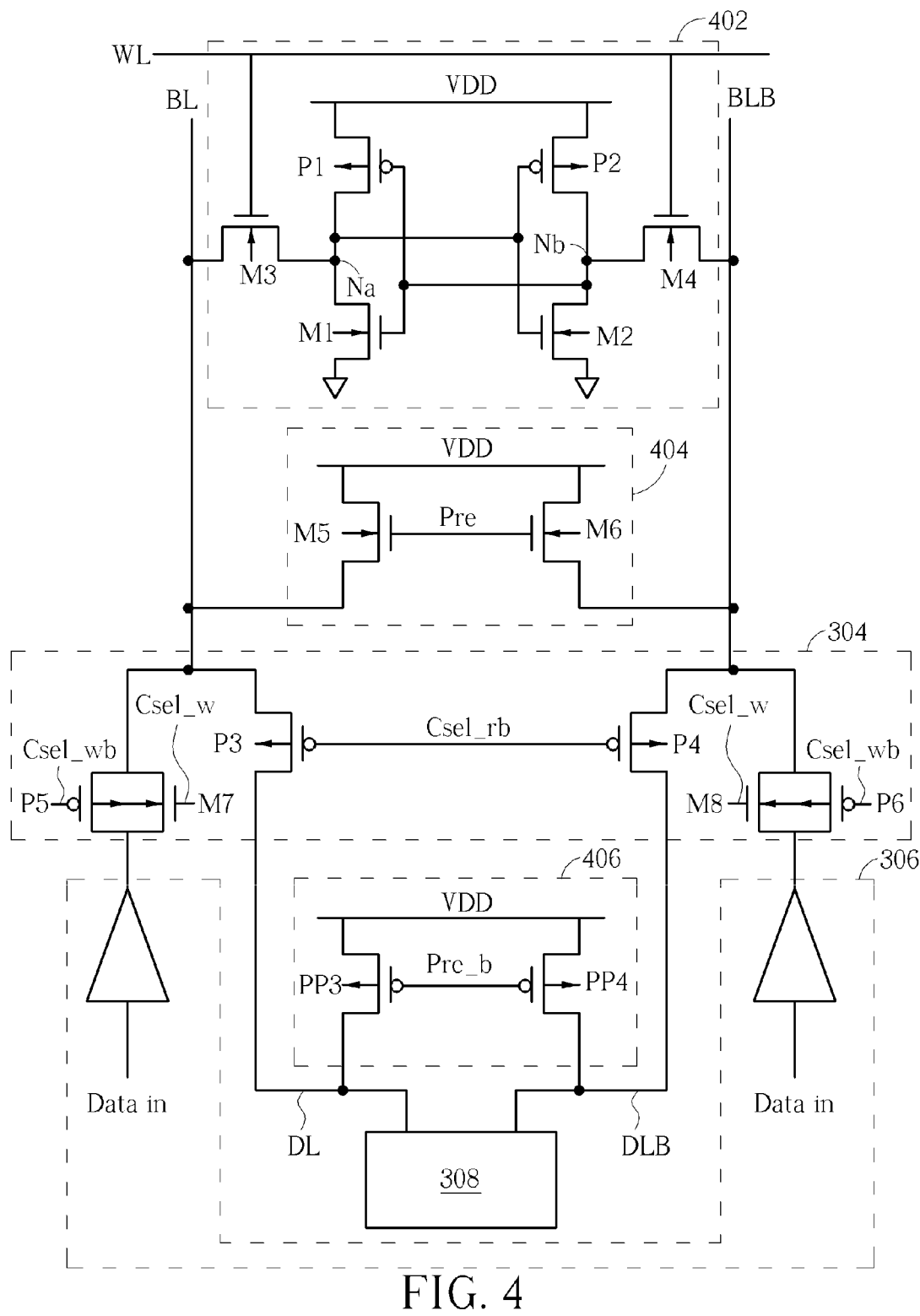
FIG. 4 is a diagram illustrating a memory cell, a local voltage source, a column multiplexer, a write buffer, and a sense amplifier of FIG. 3 according to an embodiment of the present invention.

FIG. 4 is a diagram illustrating a memory cell 402, a local voltage source 404, the column multiplexer 304, the write buffer 306, and the sense amplifier 308 of FIG. 3 according to an embodiment of the present invention. For illustration purposes, only a set of local voltage source 404 and memory cell 402 is shown in FIG. 4. The memory array 302 may include a plurality of local voltage sources 404. The memory cell 402 may be a commonly used 6T SRAM cell as the memory cell 102. Each column of memory cells in the memory array 302 is coupled to a corresponding local voltage source 404 independently.

The local voltage source 404 may include NMOS transistors M5 and M6. The NMOS transistor M5 has a first end for receiving a working voltage VDD, a second end coupled to the bit line BL, and a control end. The NMOS transistor M6 has a first end for receiving the working voltage VDD, a second end coupled to the bit line bar BLB, and a control end coupled to the control end of the NMOS transistor M5. The column multiplexer 304 may include a plurality of sets of selecting circuit, and each set of selecting circuit is coupled to a corresponding column of memory cells. Each set of selecting circuit may include PMOS transistors P3, P4, P5, P6, and NMOS transistor M7, M8. The PMOS transistors P3, P4 are used to transmit data from the bit line BL and the bit line bar BLB to a pair of data line DL and data line bar DLB coupled to the sense amplifier 308 when the memory device 300 performs a read operation. The PMOS transistors P5, P6 and the NMOS transistor M7, M8 are used to transmit data from the write buffer 306 to the bit line BL and the bit line bar BLB when the memory device 300 performs a write operation. The PMOS transistors P5, P6 are used in conjunction with the NMOS transistor M7, M8 so that a high logic (may be the working voltage VDD) may be transmitted to one of the bit line BL and the bit line bar BLB, and a low logic (may be a reference voltage VSS) lower than the working voltage VDD may be transmitted to another of the bit line BL and the bit line bar BLB. In another embodiment, the PMOS transistors P5, P6 are removed and only the NMOS transistor M7, M8 are used to transmit data, in such case, a high voltage (may be VDD−Vt, Vt being a threshold voltage of either M7 or M8) lower than the working voltage VDD may be transmitted to one of the bit line BL and the bit line bar BLB, and the low logic, which may be lower than the high voltage in this case, may be transmitted to another of the bit line BL and the bit line bar BLB.

A pre-charge circuit 406 may be coupled between the sense amplifier 308 and the column multiplexer 304. The pre-charge circuit 406 may include PMOS transistors PP3 and PP4. The pre-charge circuit 406 is used to pre-charge the bit line BL and the bit line bar BLB of a selected memory cell 402 to the working voltage VDD.

Figure 5:
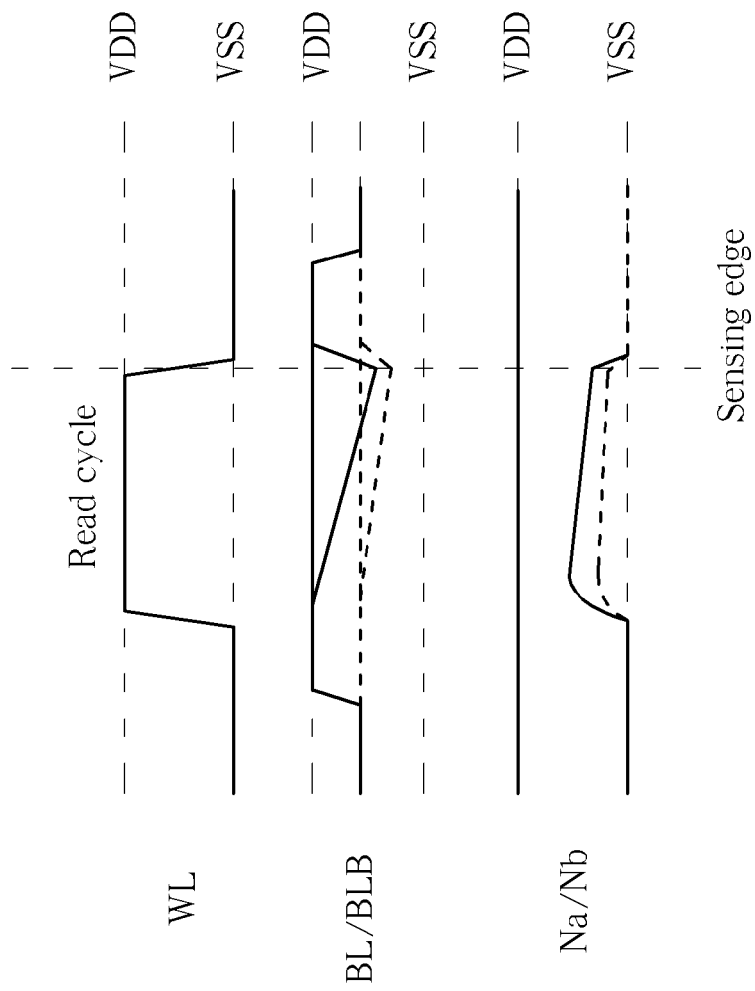
FIG. 5 is a diagram illustrating operations of FIG. 3 and FIG. 4 according to an embodiment of the present invention.

FIG. 5 is a diagram illustrating operations of FIG. 3 and FIG. 4 according to an embodiment of the present invention. The horizontal axis of FIG. 5 is time t. From top to bottom of FIG. 5 are word line WL voltage, bit line BL and bit line bar BLB voltages, and storage nodes Na and Nb voltages. The storage nodes Na and Nb are at inverse logic levels. FIG. 5 shows a period before and during a read cycle. Solid lines in FIG. 5 indicate waveforms of a memory cell 402 selected to be read, whereas dashed lines in FIG. 5 indicate waveforms of half selected memory cells 402 in other columns of the memory array 302. A method for controlling the memory device 300 is as following.

Figure 1:
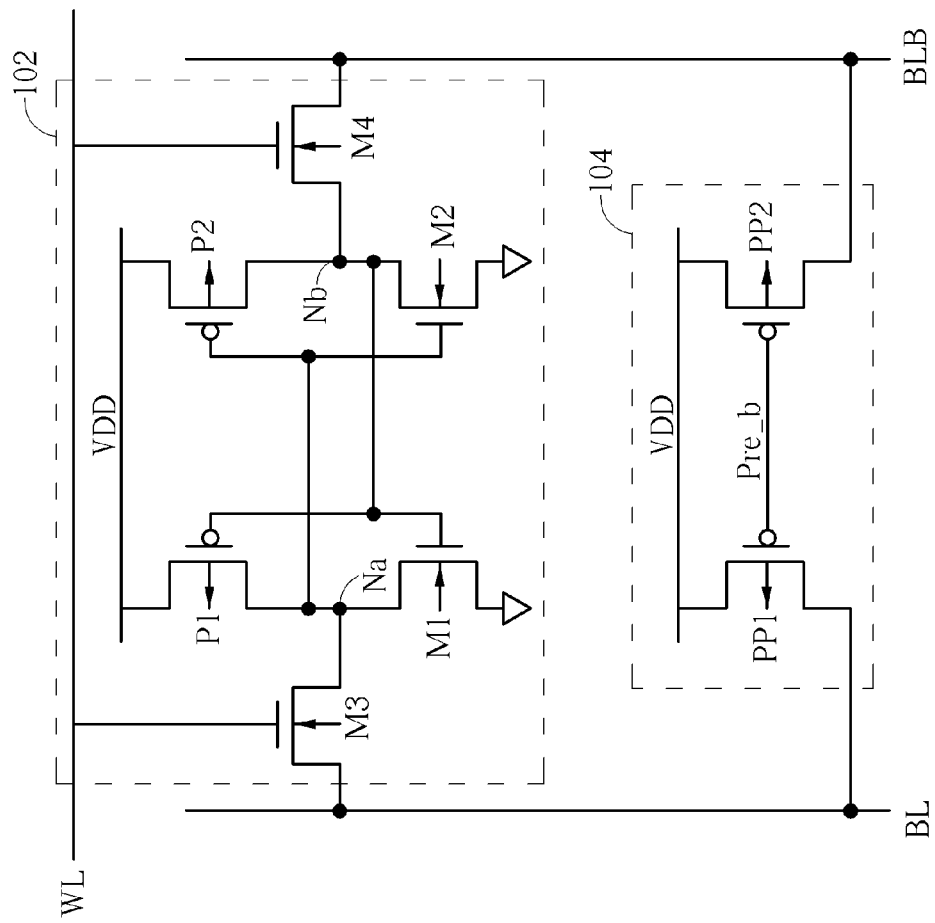
FIG. 1 is a diagram illustrating prior art memory cell and pre-charge circuit.
Figure 2:
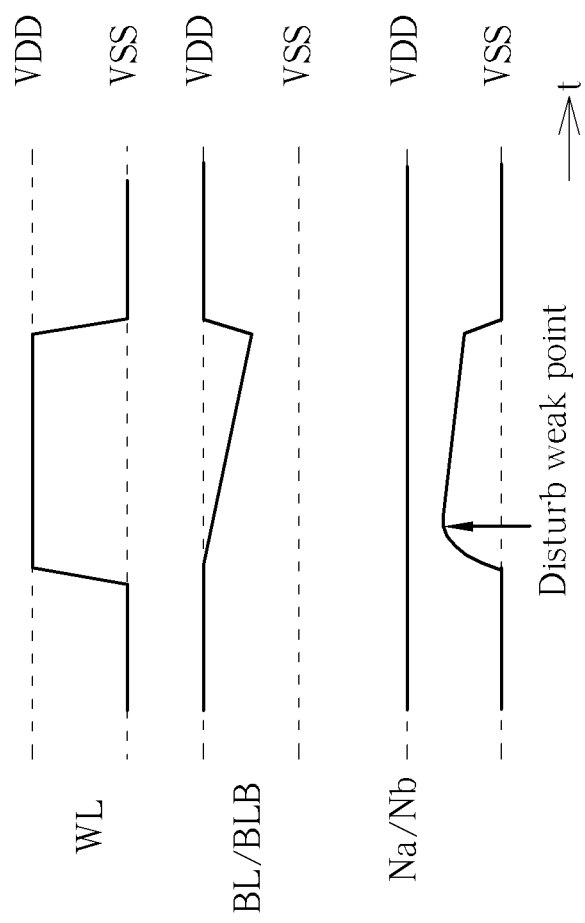
FIG. 2 is a waveform diagram of FIG. 1.

A control signal Pre_b and a control signal Csel_rb of a set of selecting circuit coupled to the pair of bit line BL and bit line bar BLB of the selected memory cell 402 are set to the low logic for turning on the PMOS transistors P3, P4, PP3, and PP4 to pre-charge the pair of bit line BL and bit line bar BLB of the selected memory cell 402 to the working voltage VDD by the pre-charge circuit 406. Control signals Csel_rb of other sets of selecting circuits coupled to remaining columns of memory cells, where memory cells 402 of the remaining columns sharing the same word line WL with the selected memory cell 402 are half selected memory cells 402, are set to the high logic for turning off the PMOS transistors P3 and P4. Control signals Pre of local voltage sources 404 coupled to the remaining columns of memory cells of the memory array 302 are set to high logic for turning on the NMOS transistor M5 and M6 to pre-charge pairs of bit line BL and bit line bar BLB of the remaining columns of memory cells to the high voltage (may be VDD−Vt, Vt being a threshold voltage of either M5 or M6) lower than the working voltage VDD. Since the high voltage is lower than the working voltage VDD, voltages divided at nodes Na or nodes Nb of the half selected memory cells 402 are lower than voltage divided at node Na or node Nb of the selected memory cells 402 as shown in FIG. 5, thereby reducing disturbance in the half selected memory cells 402. In addition, the working voltage VDD is utilized to pre-charge the selected memory cell 402, thereby keeping read speed being the same as in FIG. 1.

Figure 6:
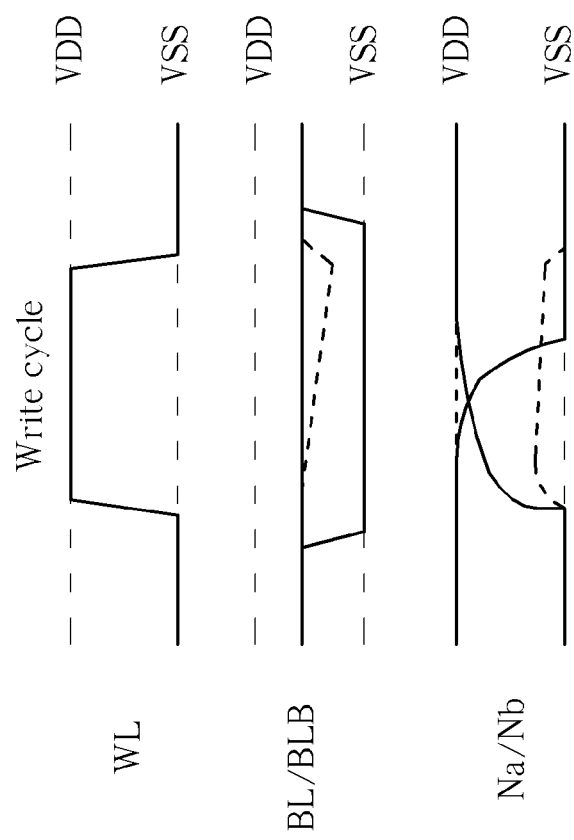
FIG. 6 is a diagram illustrating operations of FIG. 3 and FIG. 4 according to another embodiment of the present invention.

FIG. 6 is a diagram illustrating operations of FIG. 3 and FIG. 4 according to another embodiment of the present invention. The horizontal axis of FIG. 6 is time t. From top to bottom of FIG. 6 are the word line WL voltage, the bit line BL and bit line bar BLB voltages, and the storage nodes Na and Nb voltages. The storage nodes Na and Nb are at inverse logic levels. FIG. 6 shows a period before and during a write cycle. Solid lines in FIG. 6 indicate waveforms of a memory cell 402 selected to be write, whereas dashed lines in FIG. 5 indicate waveforms of half selected memory cells 402 in other columns of the memory array 302. FIG. 6 illustrates operations when the PMOS transistors P5 and P6 are removed and only the NMOS transistor M7 and M8 are used to transmit data. A method for controlling the memory device 300 is as following.

A control signal Csel_w of a set of selecting circuit coupled to the pair of bit line BL and bit line bar BLB of the selected memory cell 402 is set to the high logic for turning on the NMOS transistors M7 and M8 to transmit data from the write buffer 306 to the pair of bit line BL and bit line bar BLB of the selected memory cell 402. The high voltage (may be VDD−Vt, Vt being the threshold voltage of either M7 or M8) lower than the working voltage VDD is transmitted to represent a logic "1" at either the bit line BL or the bit line bar BLB of the selected memory cell 402 in this case. Control signals Csel_w of other sets of selecting circuit coupled to remaining columns of memory cells, where memory cells 402 of the remaining columns sharing the same word line WL with the selected memory cell 402 are half selected memory cells 402, are set to the low logic for turning off the NMOS transistors M7 and M8. Control signals Pre of local voltage sources 404 coupled to the remaining columns of memory cells of the memory array 302 are set to the high logic for turning on the NMOS transistor M5 and M6 to pre-charge pairs of bit line BL and bit line bar BLB of the remaining columns of memory cells to the high voltage (may be VDD−Vt, Vt being the threshold voltage of either M5 or M6) lower than the working voltage VDD. Since the high voltage is lower than the working voltage VDD, voltages divided at nodes Na or nodes Nb of the half selected memory cells 402 are lowered as shown in FIG. 6, thereby reducing disturbance in the half selected memory cells 402 during the write cycle. Further, pre-charge time after the write cycle and power consumption of the memory device 300 are reduced because the nodes Na or nodes Nb of the half selected memory cells 402 only need to be pre-charged to the high voltage, which is lower than the working voltage VDD.

Figure 7:
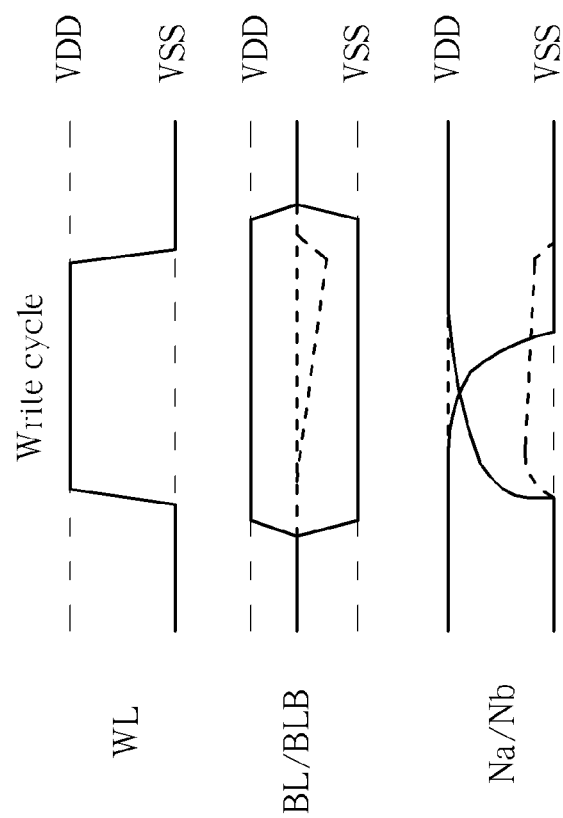
FIG. 7 is a diagram illustrating operations of FIG. 3 and FIG. 4 according to another embodiment of the present invention.

FIG. 7 is a diagram illustrating operations of FIG. 3 and FIG. 4 according to another embodiment of the present invention. The horizontal axis of FIG. 7 is time t. From top to bottom of FIG. 7 are the word line WL voltage, the bit line BL and the bit line bar BLB voltages, and storage nodes Na and Nb voltages. The storage nodes Na and Nb are at inverse logic levels. FIG. 7 shows a period before and during a write cycle. Solid lines in FIG. 7 indicate waveforms of a memory cell 402 selected to be written, whereas dashed lines in FIG. 7 indicate waveforms of half selected memory cells 402 in other columns of the memory array 302. A method for controlling the memory device 300 is as following.

A control signal Csel_w and a control signal Csel_wb of a set of selecting circuit coupled to the pair of bit line BL and bit line bar BLB of the selected memory cell 402 are set to the high logic and low logic respectively for turning on the NMOS transistors M7, M8, and the PMOS transistors P5, P6, to transmit data from the write buffer 306 to the pair of bit line BL and bit line bar BLB of the selected memory cell 402. The working voltage VDD can be transmitted to represent logic "1" at either the bit line BL or the bit line bar BLB of the selected memory cell 402 in this case by utilization of the PMOS transistors P5 and P6. Control signals Csel_w and Csel_wb of other sets of selecting circuit coupled to remaining columns of memory cells, where memory cells 402 of the remaining columns sharing the same word line WL with the selected memory cell 402 are half selected memory cells 402, are set to the low logic and the high logic respectively for turning off the NMOS transistors M7, M8, and the PMOS transistors P5, P6. Control signals Pre of local voltage sources 404 coupled to the remaining columns of memory cells of the memory array 302 are set to the high logic for turning on the NMOS transistor M5 and M6 to pre-charge pairs of bit line BL and bit line bar BLB of the remaining columns of memory cells to the high voltage (may be VDD−Vt, Vt being the threshold voltage of either M5 or M6) lower than the working voltage VDD. Since the high voltage is lower than the working voltage VDD, voltages divided at nodes Na or nodes Nb of the half selected memory cells 402 are lowered as shown in FIG. 7, thereby reducing disturbance in the half selected memory cells 402 during the write cycle. In addition, the working voltage VDD, instead of the high voltage, is transmitted to write logic "1" to the selected memory cell 402, thus good write ability of the selected memory cell 402 may be attained during the write cycle.

In summary, the present invention discloses circuit structures and methods for reducing disturbance of half selected cells during the read cycle and the write cycle while keeping read speed of the selected cell as it used to be. The present invention also reduces pre-charge time after each write cycle and reduces power consumption of the memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for driving a memory array, the memory array comprising a plurality of columns of memory cells, each column of memory cells of the memory array being coupled to a local voltage source, a bit line, and a bit line bar, the method comprising:
   providing a working voltage to pre-charge the bit line and the bit line bar of the column of memory cells when a memory cell of the column of memory cells is selected to be read; and
   using local voltage sources coupled to remaining columns of memory cells of the memory array to provide high voltages lower than the working voltage to pre-charge bit lines and bit line bars of the remaining columns of memory cells when the memory cell is selected to be read.

2. The method of claim 1 further comprising:
   providing the working voltage to one of the bit line and the bit line bar of the column of memory cells when the memory cell is selected to be written.

3. The method of claim 2 further comprising:
   providing a low voltage lower than the working voltage to another one of the bit line and the bit line bar of the column of memory cells when the memory cell is selected to be written.

4. The method of claim 3 further comprising:
   using the local voltage sources to pre-charge the bit lines and the bit line bars of the remaining columns of memory cells to the high voltages when the memory cell is selected to be written.

5. The method of claim 1 further comprising:
   providing the high voltage to one of the bit line and the bit line bar of the column of memory cells when the memory cell is selected to be written.

6. The method of claim 5 further comprising:
   providing a low voltage lower than the high voltage to another one of the bit line and the bit line bar of the column of memory cells when the memory cell is selected to be written.

7. The method of claim 6 further comprising:
   using the local voltage sources to pre-charge the bit lines and the bit line bars of the remaining columns of memory cells to the high voltages when the memory cell is selected to be written.

8. A method for driving a memory array, the memory array comprising a plurality of columns of memory cells, each column of memory cells of the columns of memory cells being coupled to a local voltage source, a bit line and a bit line bar, the local voltage source comprising a first NMOS transistor coupled between a working voltage and the bit line, and a second NMOS transistor coupled between the working voltage and the bit line bar, a control end of the first NMOS transistor being coupled to a control end of the second NMOS transistor, the method comprising:
   providing a high voltage lower than the working voltage to one of the bit line and the bit line bar of the column of memory cells when a memory cell of the column of memory cells is selected to be written; and
   providing a low voltage lower than the working voltage to another one of the bit line and the bit line bar of the column of memory cells when the memory cell is selected to be written.

9. The method of claim 8 further comprising:
   using local voltage sources coupled to remaining columns of memory cells of the columns of memory cells to pre-charge the bit lines and the bit line bars of the remaining columns of memory cells to the high voltage when the memory cell is selected to be written.

* * * * *